US011322336B2

(12) United States Patent
Shim et al.

(10) Patent No.: US 11,322,336 B2
(45) Date of Patent: May 3, 2022

(54) APPARATUS AND METHOD FOR TREATING SUBSTRATE

(71) Applicant: SEMES CO., LTD., Cheonan-si (KR)

(72) Inventors: Jae-Bak Shim, Seoul (KR); Youngjae Lim, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/591,514

(22) Filed: Oct. 2, 2019

(65) Prior Publication Data

US 2020/0111640 A1    Apr. 9, 2020

(30) Foreign Application Priority Data

Oct. 5, 2018   (KR) .................. 10-2018-0119079
Mar. 28, 2019  (KR) .................. 10-2019-0035782

(51) Int. Cl.
*H01J 37/32*     (2006.01)
*H01L 21/3065*   (2006.01)
(Continued)

(52) U.S. Cl.
CPC ..... *H01J 37/3211* (2013.01); *H01J 37/32449* (2013.01); *H01J 37/32715* (2013.01);
(Continued)

(58) Field of Classification Search
None
See application file for complete search history.

(56) References Cited

U.S. PATENT DOCUMENTS 5,478,429 A *  12/1995  Komino ............ H01J 37/32045
                                              118/723 E
2003/0057844 A1    3/2003  Windhorn et al.
(Continued)

FOREIGN PATENT DOCUMENTS

CN    102076162 A    5/2011
KR    10-0238625 B1  1/2000
(Continued)

OTHER PUBLICATIONS

Office Action for related Korean Patent Application No. 10-2019-0035782, dated Jun. 9, 2020 (4 pages).
(Continued)

*Primary Examiner* — Karla A Moore
*Assistant Examiner* — Tiffany Z Nuckols
(74) *Attorney, Agent, or Firm* — Procopio, Cory, Hargreaves & Savitch LLP

(57) ABSTRACT

Disclosed is an apparatus for treating a substrate. The apparatus includes a chamber having a space therein in which the substrate is treated, a support unit that supports the substrate in the chamber, a gas supply unit that supplies gas into the chamber, and a plasma generation unit that excites the gas in the chamber into a plasma state. The support unit includes a support plate on which the substrate is placed, a high-frequency power supply that supplies high-frequency power to the support plate, and a high-frequency transmission line through which the high-frequency power is supplied from the high-frequency power supply to the support plate. Characteristic impedance of the high-frequency transmission line is variable.

2 Claims, 6 Drawing Sheets

(51) Int. Cl.
  *H01L 21/67* (2006.01)
  *H01L 21/687* (2006.01)
(52) U.S. Cl.
  CPC .... *H01L 21/3065* (2013.01); *H01L 21/67069* (2013.01); *H01L 21/68792* (2013.01); *H01J 2237/3343* (2013.01)

(56) References Cited

U.S. PATENT DOCUMENTS

| | | | |
|---|---|---|---|
| 2007/0235426 A1 | 10/2007 | Matsumoto et al. | |
| 2008/0017111 A1* | 1/2008 | Ishisaka | H01L 21/67103 118/723 E |
| 2009/0274590 A1* | 11/2009 | Willwerth | H01L 21/68792 422/186.04 |
| 2011/0126765 A1* | 6/2011 | Yamazawa | H01J 37/32091 118/723 MW |

FOREIGN PATENT DOCUMENTS

| | | |
|---|---|---|
| KR | 10-2007-0050111 A | 5/2007 |
| KR | 10-0845896 B | 7/2008 |
| KR | 10-1333112 B | 11/2013 |
| KR | 10-2017-0110039 A | 10/2017 |
| KR | 10-2017-0140926 A | 12/2017 |
| KR | 10-2018-0019255 A | 2/2018 |

OTHER PUBLICATIONS

Notice of Allowance for related Korean Patent Application No. 10-2019-0035782, dated Oct. 28, 2020 (5 pages).
Office Action for related CN Patent Application No. 201910949255.5 dated Dec. 3, 2021, 10 pages.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Applications No. 10-2018-0119079 filed on Oct. 5, 2018 and No. 10-2019-0035782 filed on Mar. 28, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for improving etch rate uniformity across a substrate.

Semiconductor manufacturing processes may include a process of treating a substrate using plasma. For example, among the semiconductor manufacturing processes, an etching process may remove a thin film on a substrate using plasma.

To use plasma in substrate treating processes, plasma generation units for generating plasma are mounted in process chambers. The plasma generation units are broadly classified into a Capacitively Coupled Plasma (CCP) type source and an Inductively Coupled Plasma (ICP) type source according to methods of generating plasma. The CCP type source applies an RF signal to either or both of electrodes that are disposed in a chamber to face each other and generates an electric field in the chamber, thereby generating plasma. The ICP type source applies an RF signal to one or more coils installed in a chamber and induces an electromagnetic field in the chamber, thereby generating plasma.

In the case of performing an etching process in the related art, there may be a difference in etch rate between the central region and the edge region of a substrate due to an imbalance of plasma density in a chamber. Accordingly, technologies for uniformly controlling etch rates in central and edge regions of a substrate are required.

SUMMARY

Embodiments of the inventive concept provide a substrate treating apparatus and method for improving uniformity of etch rates in a central region and an edge region of a substrate by varying the characteristic impedance of a high-frequency transmission line that transmits RF power to a lower electrode.

According to an exemplary embodiment, an apparatus for treating a substrate includes a chamber having a space therein in which the substrate is treated, a support unit that supports the substrate in the chamber, a gas supply unit that supplies gas into the chamber, and a plasma generation unit that excites the gas in the chamber into a plasma state. The support unit includes a support plate on which the substrate is placed, a high-frequency power supply that supplies high-frequency power to the support plate, and a high-frequency transmission line through which the high-frequency power is supplied from the high-frequency power supply to the support plate. Characteristic impedance of the high-frequency transmission line is variable.

The high-frequency transmission line may include an inner conductor, an outer conductor that is spaced apart from the inner conductor by a predetermined distance and that surrounds the inner conductor, and a gas supply line through which gas is injected between the inner conductor and the outer conductor.

The gas supply line may include a plurality of supply lines through which gases having different permittivities are supplied, and a gas of a selected one of the plurality of supply lines may be supplied between the inner conductor and the outer conductor.

The support unit may further include a measurement device that measures voltages for respective regions of the support plate and a control device that determines the gas injected between the inner conductor and the outer conductor, based on the voltages for the respective regions of the support plate.

The control device may adjust the characteristic impedance of the high-frequency transmission line in the range of 5 ohms to 80 ohms.

According to an exemplary embodiment, an apparatus for treating a substrate includes a chamber having a space therein in which the substrate is treated, a support unit that supports the substrate in the chamber, a gas supply unit that supplies gas into the chamber, and a plasma generation unit that excites the gas in the chamber into a plasma state. The support unit includes a support plate on which the substrate is placed, a high-frequency power supply that supplies high-frequency power to the support plate, and a plurality of high-frequency transmission lines through which the high-frequency power is supplied from the high-frequency power supply to the support plate. The plurality of high-frequency transmission lines have different characteristic impedances, and a high-frequency transmission line with selected characteristic impedance, among the plurality of high-frequency transmission lines, connects the support plate and the high-frequency power supply.

Each of the plurality of high-frequency transmission lines may include an inner conductor, an outer conductor that is spaced apart from the inner conductor by a predetermined distance and that surrounds the inner conductor, and a dielectric substance located between the inner conductor and the outer conductor.

The inner conductors of the plurality of high-frequency transmission lines may have different diameters.

The outer conductors of the plurality of high-frequency transmission lines may have different outer diameters.

The dielectric substances of the plurality of high-frequency transmission lines may have different permittivities.

The support unit may further include a measurement device that measures voltages for respective regions of the support plate, and the characteristic impedance of the high-frequency transmission line may be selected based on the voltages for the respective regions of the support plate.

According to an exemplary embodiment, an apparatus for treating a substrate includes a first treating apparatus and a second treating apparatus. Each of the first treating apparatus and the second treating apparatus includes a chamber having a space therein in which the substrate is treated, a support unit that supports the substrate in the chamber, a gas supply unit that supplies gas into the chamber, and a plasma generation unit that excites the gas in the chamber into a plasma state. The support unit includes a support plate on which the substrate is placed, a high-frequency power supply that supplies high-frequency power to the support plate, and a high-frequency transmission line through which the high-frequency power is supplied from the high-frequency power supply to the support plate. Characteristic impedance of the high-frequency transmission line provided in the first treating apparatus differs from characteristic impedance of the high-frequency transmission line provided in the second treating apparatus.

The high-frequency transmission line may include an inner conductor, an outer conductor that is spaced apart from the inner conductor by a predetermined distance and that surrounds the inner conductor, and a dielectric substance located between the inner conductor and the outer conductor.

The inner conductors of the high-frequency transmission lines provided in the plurality of chambers may have different diameters.

The outer conductors of the high-frequency transmission lines provided in the plurality of chambers may have different outer diameters.

The dielectric substances of the high-frequency transmission lines provided in the plurality of chambers may have different permittivities.

According to an exemplary embodiment, a method for treating a substrate includes controlling an etch rate of the substrate by adjusting, in a preset range, characteristic impedance of a high-frequency transmission line that connects a support plate that supports the substrate and a high-frequency supply power that supplies power to the support plate.

The high-frequency transmission line may include an inner conductor and an outer conductor that is spaced apart from the inner conductor by a predetermined distance and that surrounds the inner conductor. The characteristic impedance of the high-frequency transmission line may be adjusted by adjusting permittivity between the inner conductor and the outer conductor.

The permittivity may be adjusted by a type of gas supplied between the inner conductor and the outer conductor.

The permittivity may be adjusted by changing a distance between the inner conductor and the outer conductor.

The distance between the inner conductor and the outer conductor may be adjusted by changing a diameter of the inner conductor.

The distance between the inner conductor and the outer conductor may be adjusted by changing a diameter of the outer conductor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that the inventive concept is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Hereinafter, a substrate treating apparatus for etching a substrate using plasma according to an embodiment of the inventive concept will be described. However, without being limited thereto, the inventive concept is applicable to various types of apparatuses for heating a substrate placed thereon.

Figure 1:
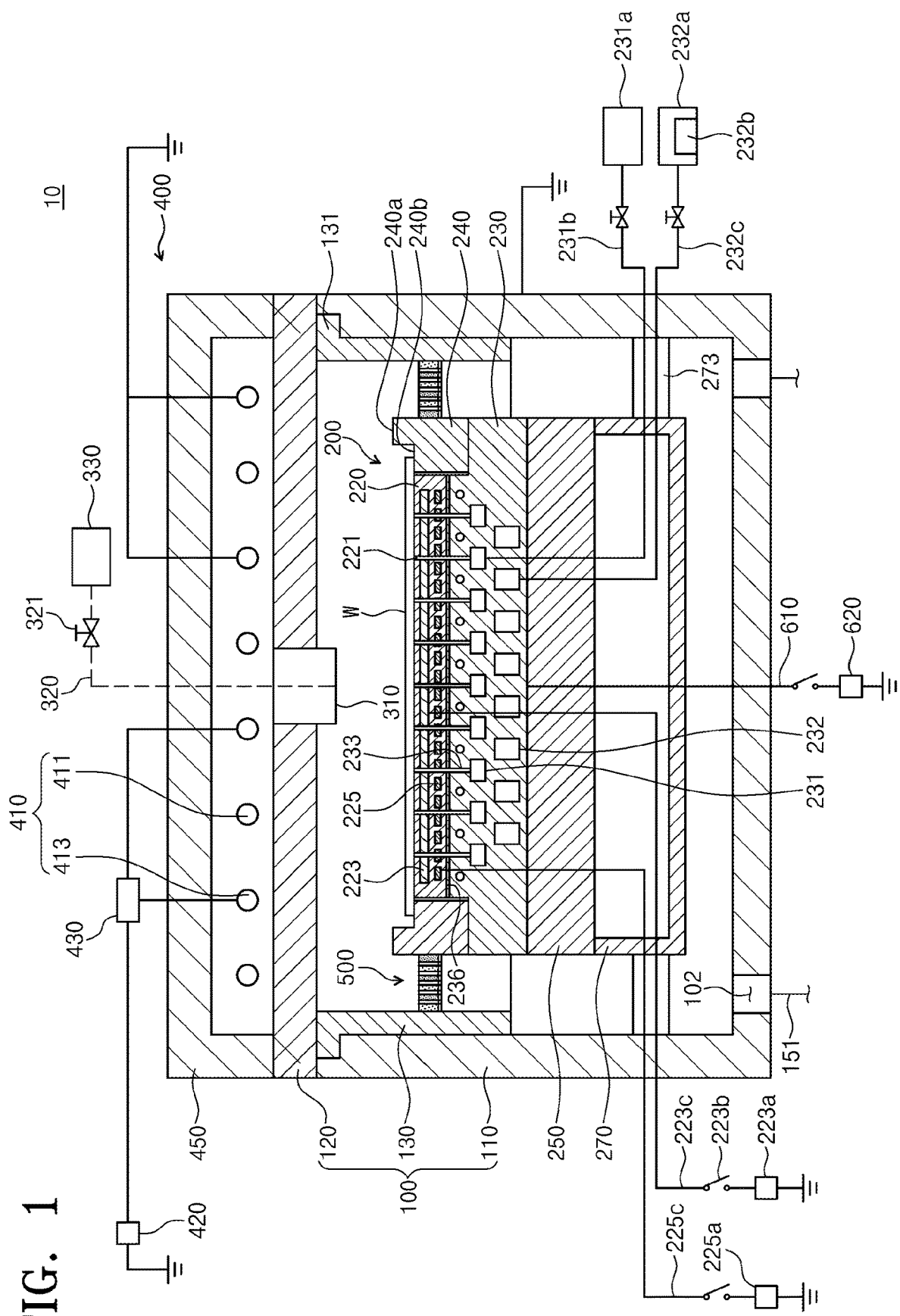
FIG. 1 is a view illustrating a substrate treating apparatus according to an embodiment of the inventive concept.

FIG. 1 is an exemplary view illustrating a substrate treating apparatus 10 according to an embodiment of the inventive concept.

Referring to FIG. 1, the substrate treating apparatus 10 treats a substrate W by using plasma. For example, the substrate treating apparatus 10 may perform an etching process on the substrate W. The substrate treating apparatus 10 may include a process chamber 100, a support unit 200, a gas supply unit 300, a plasma generation unit 400, and a baffle unit 500.

The process chamber 100 has a space in which a substrate treating process is performed. The process chamber 100 includes a housing 110, a sealing cover 120, and a liner 130.

The housing 110 has a space therein, which is open at the top. The inner space of the housing 110 serves as a processing space in which the substrate treating process is performed. The housing 110 is formed of metal. The housing 110 may be formed of aluminum. The housing 110 may be grounded. The housing 110 has an exhaust hole 102 formed in the bottom thereof. The exhaust hole 102 is connected with an exhaust line 151. Reaction byproducts generated in the substrate treating process and gases in the inner space of the housing 110 may be discharged to the outside through the exhaust line 151. The pressure inside the housing 110 is reduced to a predetermined pressure by the exhaust process.

The sealing cover 120 covers the open top of the housing 110. The sealing cover 120 has a plate shape and seals the inner space of the housing 110. The sealing cover 120 may include a dielectric substance window.

The liner 130 is provided inside the housing 110. The liner 130 is formed in a space that is open at the top and the bottom. The liner 130 may have a cylindrical shape. The liner 130 may have a radius corresponding to an inner surface of the housing 110. The liner 130 is provided along the inner surface of the housing 110. A support ring 131 is formed on an upper end of the liner 130. The support ring 131 is implemented with a plate in a ring shape and protrudes outside the liner 130 along the periphery of the liner 130. The support ring 131 is placed on an upper end of the housing 110 and supports the liner 130. The liner 130 may be formed of the same material as that of the housing 110. That is, the liner 130 may be formed of aluminum. The liner 130 protects the inner surface of the housing 110. Arc discharge may occur inside the process chamber 100 in a process of exciting a process gas. The arc discharge causes damage to surrounding devices. The liner 130 protects the inner surface of the housing 110, thereby preventing damage to the inner surface of the housing 110 by the arc discharge. Furthermore, the liner 130 prevents impurities generated during the substrate treating process from being deposited on an inner wall of the housing 110. The liner 130 is inexpensive and is easy to replace, compared with the housing 110. Therefore, in the case where the liner 130 is damaged by the arc discharge, an operator may replace the liner 130 with a new one.

The support unit 200 is located inside the housing 110. The support unit 200 supports the substrate W. The support unit 200 may include an electrostatic chuck 210 that clamps the substrate W using electrostatic force. Alternatively, the support unit 200 may support the substrate W in various manners such as mechanical clamping. Hereinafter, the support unit 200 including the electrostatic chuck 210 will be described.

The support unit 200 includes the electrostatic chuck 210, an insulation plate 250, and a lower cover 270. The support unit 200 may be located in the process chamber 100 and may be spaced apart upward from the bottom of the housing 110.

The electrostatic chuck 210 includes a dielectric plate 220, a lower electrode 223, a heater 225, a support plate 230, and a focus ring 240.

The dielectric plate 220 is located at the top of the electrostatic chuck 210. The dielectric plate 220 is formed of a dielectric substance in a circular plate shape. The substrate W is placed on an upper surface of the dielectric plate 220. The upper surface of the dielectric plate 220 has a smaller radius than the substrate W. Therefore, the edge region of the substrate W is located outside the dielectric plate 220. The dielectric plate 220 has a first supply fluid channel 221 formed therein. The first supply fluid channel 221 extends from the upper surface of the dielectric plate 210 to the bottom surface thereof. A plurality of first supply fluid channels 221 are formed to be spaced apart from each other and serve as passages through which a heat transfer medium is supplied to the backside of the substrate W.

The lower electrode 223 and the heater 225 are buried in the dielectric plate 220. The lower electrode 223 is located over the heater 225. The lower electrode 223 is electrically connected with a first lower power supply 223a. The first lower power supply 223a includes a Direct Current (DC) power supply. A switch 223b is installed between the lower electrode 223 and the first lower power supply 223a. The lower electrode 223 may be electrically connected with, or disconnected from, the first lower power supply 223a by turning on or off the switch 223b. When the switch 223b is turned on, DC current is applied to the lower electrode 223. Electrostatic force is applied between the lower electrode 223 and the substrate W by the current applied to the lower electrode 223, and the substrate W is clamped to the dielectric plate 220 by the electrostatic force.

The heater 225 is electrically connected with a second lower power supply 225a. The heater 225 generates heat by resisting current applied by the second lower power supply 225a. The generated heat is transferred to the substrate W through the dielectric plate 220. The substrate W is maintained at a predetermined temperature by the heat generated from the heater 225. The heater 225 includes a spiral coil.

The support plate 230 is located under the dielectric plate 220. The bottom surface of the dielectric plate 220 and an upper surface of the support plate 230 may be bonded together by an adhesive 236. The support plate 230 may be formed of aluminum. The upper surface of the support plate 230 may have a step such that the central region is located in a higher position than the edge region. The central region of the upper surface of the support plate 230 has an area corresponding to the bottom surface of the dielectric plate 220 and is bonded to the bottom surface of the dielectric plate 220. The support plate 230 has a first circulation fluid channel 231, a second circulation fluid channel 232, and second supply fluid channels 233 formed therein.

The support plate 230 may include a metal plate. The support plate 230 may be connected with a high-frequency power supply 620 through a high-frequency transmission line 610. Power may be applied from the high-frequency power supply 620 to the support plate 230, and the support plate 230 may allow plasma generated in the processing space to be effectively supplied to the substrate W. That is, the support plate 230 may function as an electrode. In FIG. 1, the substrate treating apparatus 10 is implemented in the ICP type. However, without being limited thereto, the substrate treating apparatus 10 according to an embodiment of the inventive concept may be implemented in a CCP type. In the case where the substrate treating apparatus 10 is implemented in a CCP type, the high-frequency transmission line 610 may be connected to a lower electrode for generating plasma, and power may be applied from the high-frequency power supply 620 to the lower electrode.

The first circulation fluid channel 231 serves as a passage through which the heat transfer medium circulates. The first circulation fluid channel 231 may be formed in a spiral shape in the support plate 230. Alternatively, the first circulation fluid channel 231 may include fluid channels in a ring shape that have different radii and the same center. The first circulation fluid channels 231 may connect to each other. The first circulation fluid channels 231 are formed at the same height.

The second circulation fluid channel 232 serves as a passage through which cooling fluid circulates. The second circulation fluid channel 232 may be formed in a spiral shape in the support plate 230. Alternatively, the second circulation fluid channel 232 may include fluid channels in a ring shape that have different radii and the same center. The second circulation fluid channels 232 may connect to each other. The second circulation fluid channels 232 may have a larger cross-sectional area than the first circulation fluid channels 231. The second circulation fluid channels 232 are formed at the same height. The second circulation fluid channels 232 may be located under the first circulation fluid channels 231.

The second supply fluid channels 233 extend upward from the first circulation fluid channels 231 to the upper surface of the support plate 230. As many second supply fluid channels 233 as the first supply fluid channels 221 are provided. The second supply fluid channels 233 connect the first circulation fluid channels 231 and the first supply fluid channels 221.

The first circulation fluid channels 231 are connected to a heat transfer medium reservoir 231a through a heat transfer medium supply line 231b. The heat transfer medium reservoir 231a has a heat transfer medium stored therein. The heat transfer medium includes an inert gas. According to an embodiment, the heat transfer medium includes a helium (He) gas. The helium gas is supplied into the first circulation fluid channels 231 through the heat transfer medium supply line 231b and then supplied to the backside of the substrate W via the second supply fluid channels 233 and the first supply fluid channels 221 in a serial order. The helium gas serves as a medium through which heat transferred from plasma to the substrate W is transferred to the electrostatic chuck 210.

The second circulation fluid channels 232 are connected with a cooling fluid reservoir 232a through a cooling fluid supply line 232c. The cooling fluid reservoir 232a has cooling fluid stored therein. The cooling fluid reservoir 232a may include a cooler 232b therein. The cooler 232b cools the cooling fluid to a predetermined temperature. Alternatively, the cooler 232b may be mounted on the cooling fluid supply line 232c. The cooling fluid supplied into the second circulation fluid channels 232 via the cooling fluid supply line 232c cools the support plate 230 while circulating along the second circulation fluid channels 232. The support plate 230, while being cooled, cools the dielectric plate 220 and the substrate W together to maintain the substrate W at a predetermined temperature.

The focus ring 240 is disposed on the edge region of the electrostatic chuck 210. The focus ring 240 has a ring shape and is disposed around the dielectric plate 220. An upper surface of the focus ring 240 may have a step such that an outer portion 240a is located in a higher position than an inner portion 240b. The inner portion 240b of the upper surface of the focus ring 240 is located at the same height as the upper surface of the dielectric plate 220. The inner portion 240b of the upper surface of the focus ring 240 supports the edge region of the substrate W that is located outside the dielectric plate 220. The outer portion 240a of the focus ring 240 surrounds the edge region of the substrate W. The focus ring 240 allows plasma in the process chamber 100 to be concentrated on the region opposite the substrate W.

The insulation plate 250 is located under the support plate 230. The insulation plate 250 has a cross-sectional area corresponding to that of the support plate 230. The insulation plate 250 is located between the support plate 230 and the lower cover 270. The insulation plate 250 is formed of an insulating material and electrically insulates the support plate 230 and the lower cover 270.

The lower cover 270 is located at the bottom of the support unit 200. The lower cover 270 is spaced apart upward from the bottom of the housing 110. The lower cover 270 has a space formed therein, which is open at the top. The open top of the lower cover 270 is covered with the insulation plate 250. Accordingly, the outer diameter of the cross-section of the lower cover 270 may be the same as the outer diameter of the insulation plate 250. The lower cover 270 may have, in an inner space thereof, a lift pin module (not illustrated) that moves the transferred substrate W from an external transfer member to the electrostatic chuck 210.

The lower cover 270 has a connecting member 273. The connecting member 273 connects the outer surface of the lower cover 270 and the inner wall of the housing 110. A plurality of connecting members 273 may be provided at predetermined intervals on the outer surface of the lower cover 270. The connecting members 273 support the support unit 200 inside the process chamber 100. Furthermore, the connecting members 273 are connected with the inner wall of the housing 110 to allow the lower cover 270 to be electrically grounded. A first power line 223c connected with the first lower power supply 223a, a second power line 225c connected with the second lower power supply 225a, the heat transfer medium supply line 231b connected with the heat transfer medium reservoir 231a, and the cooling fluid supply line 232c connected with the cooling fluid reservoir 232a extend toward the inside of the lower cover 270 via the inner spaces of the connecting members 273.

The gas supply unit 300 supplies a process gas into the process chamber 100. The gas supply unit 300 includes a gas supply nozzle 310, a gas supply line 320, and a gas reservoir 330. The gas supply nozzle 310 is installed in the center of the sealing cover 120. The gas supply nozzle 310 has an injection hole formed in a bottom surface thereof. The injection hole is located below the sealing cover 120 and supplies the process gas into the processing space in the process chamber 100. The gas supply line 320 connects the gas supply nozzle 310 and the gas reservoir 330. The gas supply line 320 supplies the process gas stored in the gas reservoir 330 to the gas supply nozzle 310. A valve 321 is installed in the gas supply line 320. The valve 321 opens or closes the gas supply line 320 and adjusts the flow rate of the process gas supplied through the gas supply line 320.

The plasma generation unit 400 excites the process gas in the process chamber 100 into a plasma state. According to an embodiment of the inventive concept, the plasma generation unit 400 may be of an ICP type.

The plasma generation unit 400 may include a high-frequency power supply 420, a first antenna 411, a second antenna 413, and a power divider 430. The high-frequency power supply 420 supplies a high-frequency signal. For example, the high-frequency power supply 420 may be an RF power supply 420. The RF power supply 420 supplies RF power. Hereinafter, it will be exemplified that the high-frequency power supply 420 is the RF power supply 420. The first antenna 411 and the second antenna 413 are connected with the RF power supply 420 in series. Each of the first antenna 411 and the second antenna 413 may be implemented with a coil wound a plurality of times. The first antenna 411 and the second antenna 413 are electrically connected to the RF power supply 420 to receive RF power. The power divider 430 distributes the power from the RF power supply 420 to the first antenna 411 and the second antenna 413.

The first antenna 411 and the second antenna 413 may be disposed in positions opposite the substrate W. For example, the first antenna 411 and the second antenna 413 may be installed over the process chamber 100. The first antenna 411 and the second antenna 413 may have a ring shape. The first antenna 411 may have a smaller radius than the second antenna 413. Furthermore, the first antenna 411 may be located on an upper inner side of the process chamber 100, and the second antenna 413 may be located on an upper outer side of the process chamber 100.

According to an embodiment, the first and second antennas 411 and 413 may be disposed around a side of the process chamber 100. According to an embodiment, one of the first and second antennas 411 and 413 may be disposed over the process chamber 100, and the other may be disposed around the side of the process chamber 100. The positions of the antennas 411 and 413 are not limited as long as the antennas 411 and 413 generate plasma in the process chamber 100.

The first antenna 411 and the second antenna 413 may receive RF power from the RF power supply 420 and may induce a time varying electro-magnetic field in the process chamber 100. Accordingly, the process gas supplied into the process chamber 100 may be excited into plasma.

The baffle unit 500 is located between the inner wall of the housing 110 and the support unit 200. The baffle unit 500 includes a baffle having through-holes. The baffle has an annular ring shape. The process gas supplied into the housing 110 passes through the through-holes of the baffle and is discharged through the exhaust hole 102. The flow of the process gas may be controlled depending on the shape of the baffle and the shape of the through-holes.

Hereinafter, a method of varying the characteristic impedance of a high-frequency transmission line for supplying high-frequency power from a high-frequency power supply to a support plate will be described with reference to FIGS. 2 to 5.

Figure 2:
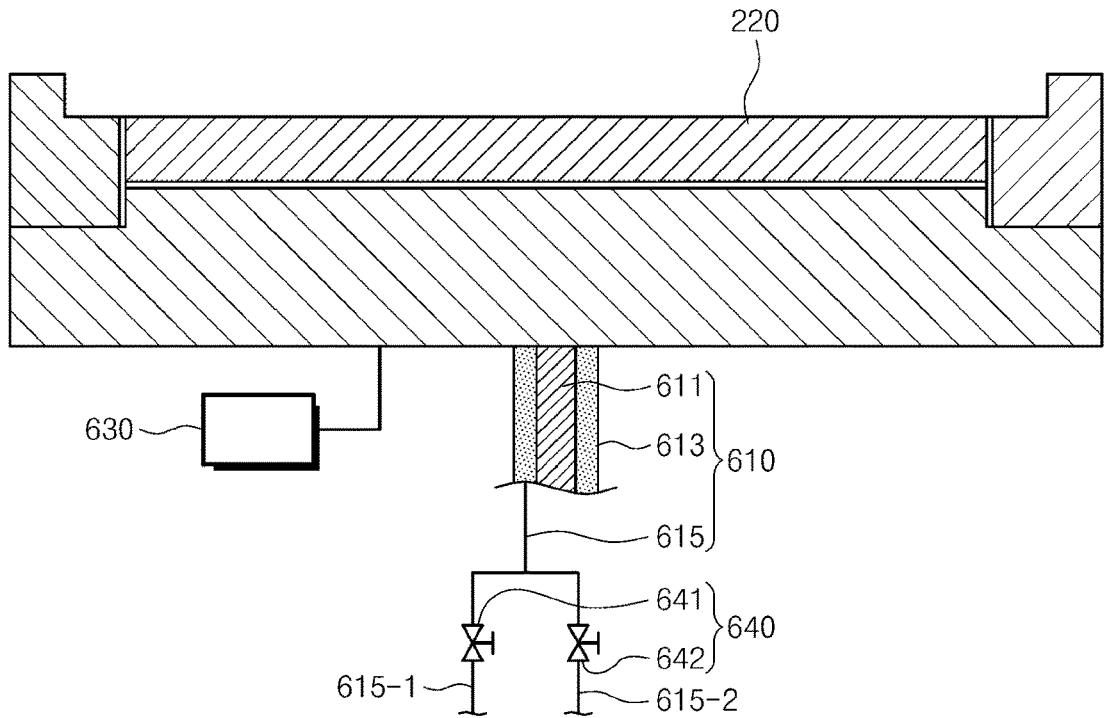
FIG. 2 is a view illustrating a method of varying the characteristic impedance of a high-frequency transmission line including a gas supply line according to an embodiment of the inventive concept.

Referring to FIG. 2, the high-frequency transmission line 610 may have a coaxial line structure. Specifically, the high-frequency transmission line 610 may include an inner conductor 611, an outer conductor 613 that is spaced apart from the inner conductor 611 by a predetermined distance and that surrounds the inner conductor 611, and a gas supply line 615 through which gas is injected into the space between the inner conductor 611 and the outer conductor 613. The gas supply line 615 may include a plurality of supply lines 615-1 and 615-2 for supplying gases having different permittivities, and a gas of a selected one of the plurality of supply lines 615-1 and 615-2 may be supplied into the space between the inner conductor 611 and the outer conductor 613. Accordingly, the characteristic impedance of the high-frequency transmission line 610 may be varied, which results in a variation in the impedance of the process chamber 100. Because etch rates for respective regions of the substrate W vary depending on the impedance of the process chamber 100, the uniformity of etch rates for the respective regions of the substrate W may be improved by appropriately adjusting the characteristic impedance of the high-frequency transmission line 610 according to processes.

The characteristic impedance of the high-frequency transmission line 610 is determined depending on the gap between the inner conductor 611 and the outer conductor 613, the diameter of the outer conductor 613, and the permittivity of a dielectric substance between the inner conductor 611 and the outer conductor 613. When "a" denotes the diameter of the inner conductor 611, "b" denotes the diameter of the outer conductor 613, and "$\varepsilon_r$" denotes the permittivity of the dielectric substance, the characteristic impedance $Z_0$ may be given by Equation 1 below.

$$Z_0 = \frac{60}{\sqrt{\varepsilon_r}} \ln \frac{b}{a} \quad \text{[Equation 1]}$$

As shown in Equation 1, when other conditions are equal, the characteristic impedance $Z_0$ is proportional to the diameter of the outer conductor 613 and inversely proportional to the diameter of the inner conductor 611 and the permittivity of the dielectric substance. In other words, when other conditions are equal, the characteristic impedance $Z_0$ decreases with an increase in the diameter of the inner conductor 611 or an increase in the permittivity of the dielectric substance and increases with an increase in the diameter of the outer conductor 613. Accordingly, the characteristic impedance $Z_0$ of the high-frequency transmission line 610 may be adjusted by adjusting any one of the diameter of the inner conductor 611 of the high-frequency transmission line 610, the diameter of the outer conductor 613 thereof, and the permittivity of the dielectric substance. The high-frequency transmission line 610 according to an embodiment of the inventive concept may selectively supply gases having different permittivities between the inner conductor 611 and the outer conductor 613, thereby varying the permittivity of the dielectric substance, and thus the characteristic impedance of the high-frequency transmission line 610 may be adjusted.

The support unit 700 may include a measurement device 630 (or a voltmeter) that measures voltages for respective regions of the support plate 230 and a control device 640 that determines a gas to be injected into the space between the inner conductor 611 and the outer conductor 613, based on the voltages for the respective regions of the support plate 230. The control device 640 may be implemented with, but is not limited to, a plurality of valves 641 and 642. Depending on the voltages for the respective regions of the support plate 230, which are measured by the measurement device 630, the control device 640 may select an appropriate supply line from the plurality of supply lines 615-1 and 615-2 to change the permittivity of a gas supplied into the space between the inner conductor 611 and the outer conductor 613, thereby adjusting the characteristic impedance of the high-frequency transmission line 610, which in turn controls etch rates for respective regions of the substrate W. For example, the control device 640 may select one of the plurality of supply lines 615-1 and 615-2 to adjust the characteristic impedance of the high-frequency transmission line 610 in the range of 5 ohms to 80 ohms, thereby improving the uniformity of etch rates for the respective regions of the substrate W. Furthermore, the control device 640 may adjust the characteristic impedance of the high-frequency transmission line 610 to less than 5 ohms or more than 80 ohms. Meanwhile, although it has been exemplified that the gas supply line 615 according to the embodiment of the inventive concept includes the two supply lines 615-1 and 615-2, the gas supply line 615, without being limited thereto, may include three or more supply lines.

Figure 3:
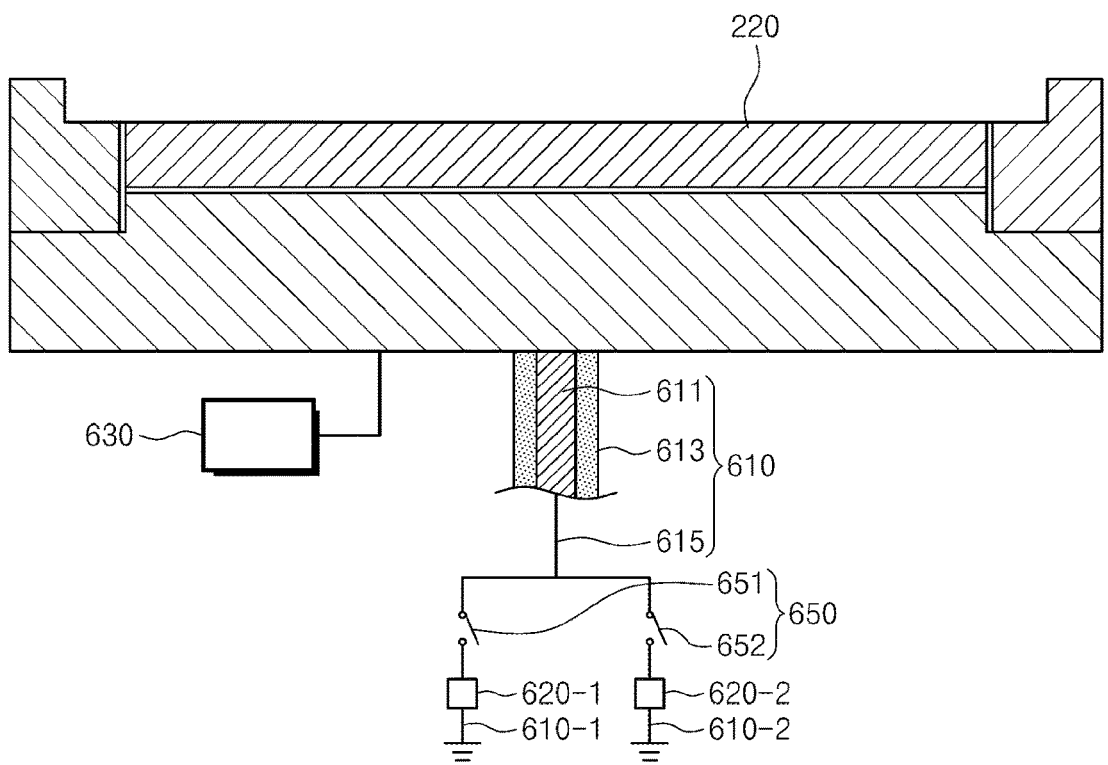
FIGS. 3 to 6 are views illustrating a method of varying the characteristic impedance of a high-frequency transmission line in a support unit including a plurality of high-frequency transmission lines according to an embodiment of the inventive concept.

Referring to FIG. 3, the high-frequency transmission line 610 may include a plurality of high-frequency transmission lines 610-1 and 610-2 having different characteristic impedances. Among the plurality of high-frequency transmission lines 610-1 and 610-2, a high-frequency transmission line with selected characteristic impedance may connect the support plate 230 and the high-frequency power supply 620.

Figure 4:
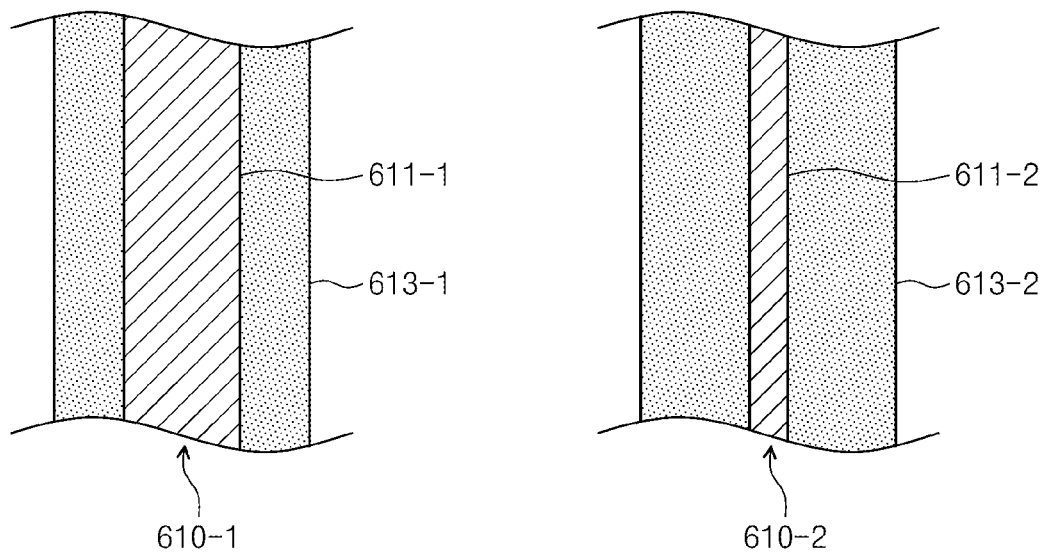
Figure 5:
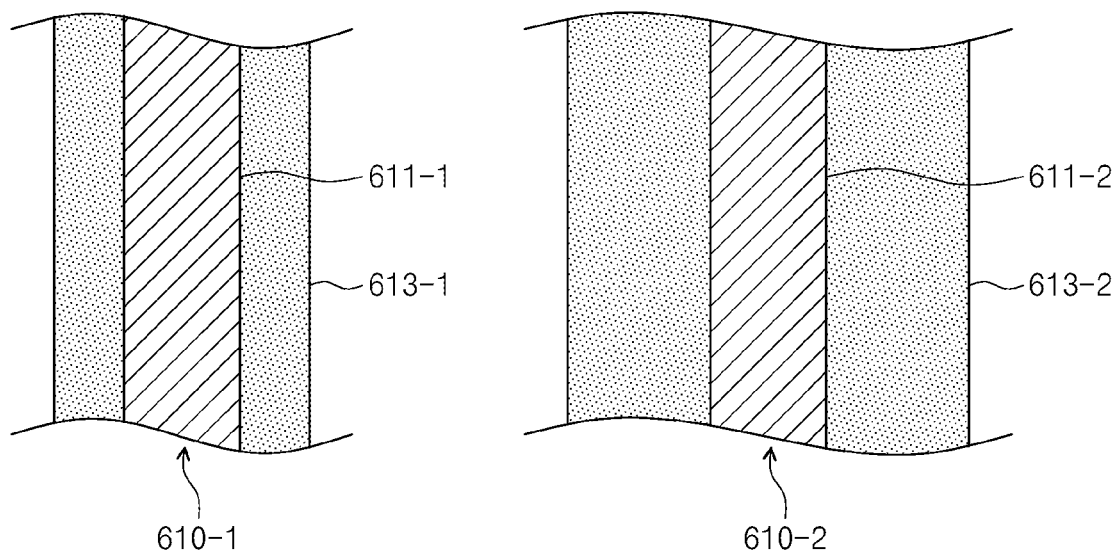
Figure 6:
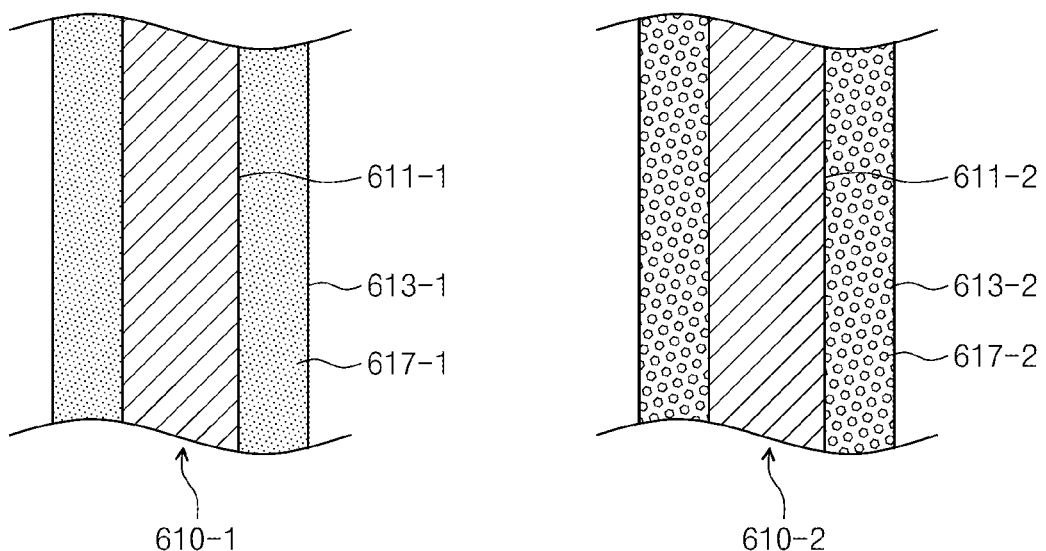

Specifically, each of the plurality of high-frequency transmission lines 610-1 and 610-2 may include an inner conductor 611-1, 611-2, an outer conductors 613-1, 613-2 that is spaced apart from the inner conductor 611-1, 611-2 by a predetermined distance and that surrounds the inner conductor 611-1, 611-2, and a dielectric substance 617-1, 617-2 that is located between the inner conductor 611-1, 611-2 and the outer conductor 613-1, 613-2. The plurality of high-frequency transmission lines 610-1 and 610-2 may be provided such that, as illustrated in FIG. 4, the outer conductors 613-1 and 613-2 have the same diameter and the inner conductors 611-1 and 611-2 have different diameters, or as illustrated in FIG. 5, the inner conductors 611-1 and 611-2 have the same diameter and the outer conductors 613-1 and 613-2 have different diameters. Alternatively, the plurality of high-frequency transmission lines 610-1 and 610-2 may be provided such that, as illustrated in FIG. 6, the inner conductors 611-1 and 611-2 have the same diameter, the outer conductors 613-1 and 613-2 have the same diameter, and the dielectric substances 617-1 and 617-2 located between the inner conductors 611-1 and 611-2 and the outer conductors 613-1 and 613-2 have different permittivities. As described above, the characteristic impedances of the high-frequency transmission lines 610-1 and 610-2 are varied when the diameters of the inner conductors 611-1 and 611-2 of the high-frequency transmission lines 610-1 and 610-2 differ from each other, the diameters of the outer conductors 613-1 and 613-2 differ from each other, or the permittivities of the dielectric substances 617-1 and 617-2 differ from each other. Accordingly, an appropriate high-frequency transmission line 610-1 or 610-2 may be allowed to be connected with the support plate 230 according to processes, thereby controlling an etch rate over the substrate W.

That is, in the case of having to raise the characteristic impedance of the high-frequency transmission line 610 to improve the uniformity of etch rates for respective regions of the substrate W according to processes, the high-frequency transmission line 610-1 or 610-2 including the inner conductor 611-1 or 611-2 having a smaller diameter may be connected with the support plate 230, the high-frequency transmission line 610-1 or 610-2 including the outer conductor 613-1 or 613-2 having a larger diameter may be connected with the support plate 230, or the high-frequency transmission line 610-1 or 610-2 including the dielectric substance 617-1 or 617-2 having a lower permittivity may be connected with the support plate 230. In contrast, in the case of having to lower the characteristic impedance of the high-frequency transmission line 610, the high-frequency transmission line 610-1 or 610-2 including the inner conductor 611-1 or 611-2 having a larger diameter may be connected with the support plate 230, the high-frequency transmission line 610-1 or 610-2 including the outer conductor 613-1 or 613-2 having a smaller diameter may be connected with the support plate 230, or the high-frequency transmission line 610-1 or 610-2 including the dielectric substance 617-1 or 617-2 having a higher permittivity may be connected with the support plate 230. Because etch rates for respective regions of the substrate W vary depending on the impedance of the process chamber 100, the uniformity of etch rates for the respective regions of the substrate W may be improved by appropriately adjusting the characteristic impedance of the high-frequency transmission line 610 according to processes.

Furthermore, the support unit 200 may include the measurement device 630 that measures the voltages for the respective regions of the support plate 230, and the characteristic impedance of the high-frequency transmission line 610-1 or 610-2 may be selected depending on the voltages for the respective regions of the support plate 230 that are measured by the measurement device 630. In this case, the high-frequency transmission line 610-1 or 610-2 may be controlled, by a control device 650 including switches 651 and 652, to be connected with the support plate 230 by the switch 651 or 652.

Figure 7:
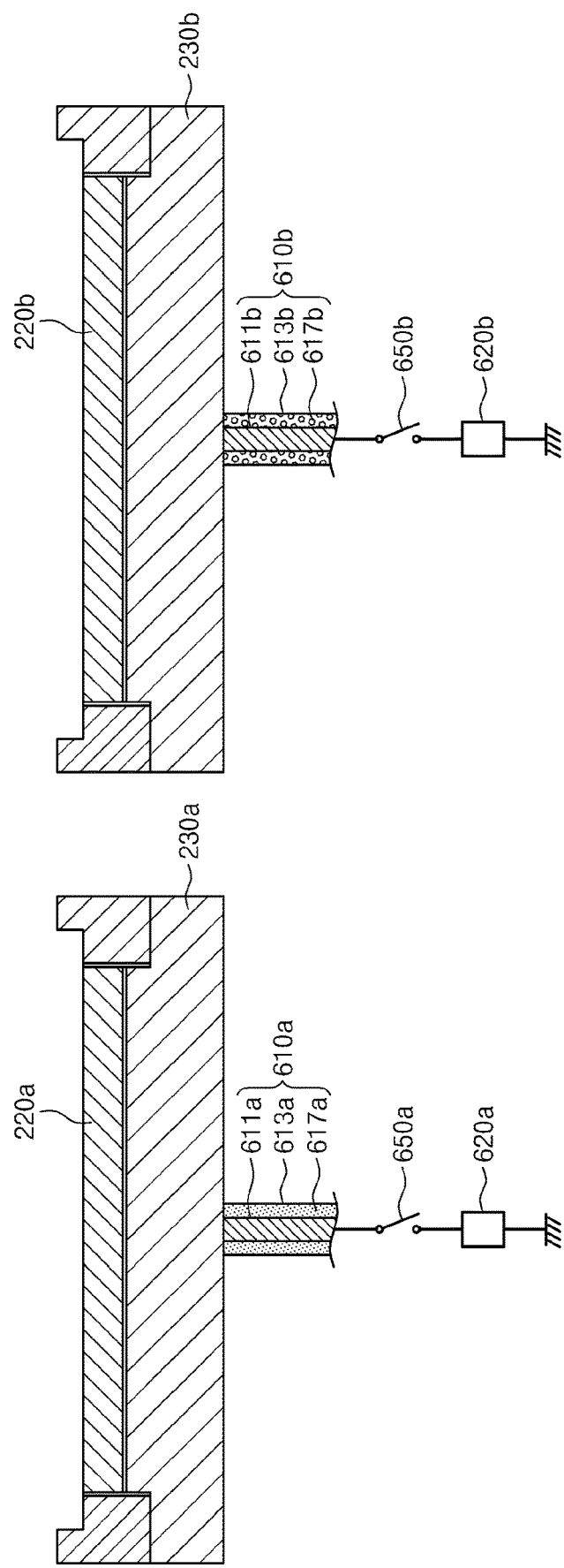
FIG. 7 is a view illustrating a method of varying the characteristic impedance of a high-frequency transmission line in a substrate treating apparatus having a plurality of treating apparatuses according to an embodiment of the inventive concept.

Referring to FIG. 7, a substrate treating apparatus 10 according to an embodiment of the inventive concept may include a first treating apparatus and a second treating apparatus. Each of the first treating apparatus and the second treating apparatus may include a high-frequency transmission line 610$a$, 610$b$ and a high-frequency power supply 620$a$, 620$b$.

Each of the high-frequency transmission lines 610$a$ and 610$b$ provided in the treating apparatuses may include an inner conductor 611$a$, 611$b$, an outer conductor 613$a$, 613$b$ that is spaced apart from the inner conductor 611$a$, 611$b$ by a predetermined distance and that surrounds the inner conductor 611$a$, 611$b$, and a dielectric substance 617$a$, 617$b$ located between the inner conductor 611$a$, 611$b$ and the outer conductor 613$a$, 613$b$. The high-frequency transmission lines 610$a$ and 610$b$ may be provided such that the diameters of the inner conductors 611$a$ and 611$b$ differ from each other, the diameters of the outer conductors 613$a$ and 613$b$ differ from each other, and the permittivities of the dielectric substances 617$a$ and 617$b$ differ from each other. Accordingly, etch rate uniformity of a substrate may be improved by performing a process in the treating apparatus including the high-frequency transmission line 610$a$ or 610$b$ having appropriate characteristic impedance depending on the process. Meanwhile, although it has been exemplified that the substrate treating apparatus according to the embodiment of the inventive concept includes the first and second treating apparatuses, the substrate treating apparatus, without being limited thereto, may be implemented with three or more treating apparatuses.

Figure 8:
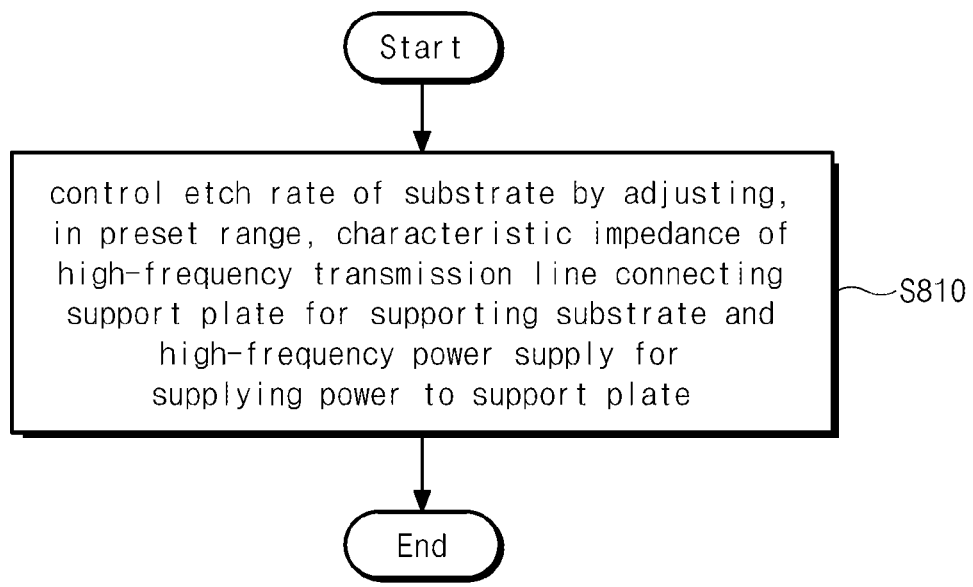
FIG. 8 is a flowchart illustrating a substrate treating method according to an embodiment of the inventive concept.

Referring to FIG. 8, an etch rate of a substrate is controlled by adjusting, in a preset range, the characteristic impedance of a high-frequency transmission line that connects a support plate for supporting the substrate and a high-frequency power supply for supplying power to the support plate (S810). Here, the high-frequency transmission line may include an inner conductor and an outer conductor that is spaced apart from the inner conductor by a predetermined distance and that surrounds the inner conductor, and the characteristic impedance of the high-frequency transmission line may be adjusted by adjusting the permittivity between the inner conductor and the outer conductor. For example, one of a plurality of gases with different etch rates may be supplied between the inner conductor and the outer conductor by using a gas supply line provided between the inner conductor and the outer conductor. Furthermore, the permittivity between the inner conductor and the outer conductor may be adjusted by changing the distance between the inner conductor and the outer conductor. For example, one of a plurality of high-frequency transmission lines including inner conductors having different diameters may be controlled to be selectively connected to the support plate, or one of a plurality of high-frequency transmission lines including outer conductors having different diameters may be controlled to be selectively connected to the support plate.

According to the various embodiments of the inventive concept, the uniformity of etch rates for respective regions of a substrate may be improved by varying the characteristic impedance of a high-frequency transmission line.

The above-described substrate treating method may be implemented as a program that can be executed by a computer. The plasma generation unit control method may be executed in an application form and may be stored in a computer readable recording medium. Here, the computer readable recording medium may be, but is not limited to, a volatile memory such as a Static RAM (SRAM), a Dynamic RAM (DRAM) or a Synchronous DRAM (SDRAM), a non-volatile memory such as a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM) or a Ferroelectric RAM (FRAM), a floppy disk, a hard disk, or an optically readable medium (e.g., a storage medium such as a CD-ROM, a DVD, or the like).

According to the various embodiments of the inventive concept, the uniformity of etch rates for respective regions of a substrate may be improved by varying the characteristic impedance of a high-frequency transmission line.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. For example, the components illustrated in the embodiments of the inventive concept can be implemented in a distributed manner. Likewise, the components described to be distributed can be implemented in a combined manner. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber having a space therein in which the substrate is treated;
   a support unit configured to support the substrate in the chamber;
   a gas supply line configured to supply gas into the chamber;
   a first high-frequency power supply configured to excite the gas in the chamber into a plasma state,
   wherein file support unit includes:
      a support plate on which the substrate is placed;
      a second high-frequency power supply configured to supply high-frequency power to the support plate; and
      a high-frequency transmission line through which the high-frequency power is supplied from the second high-frequency power supply to the support plate,
      wherein high-frequency transmission line includes:
         an inner conductor;
         an outer conductor spaced apart from the inner conductor by a predetermined distance and configured to surround the inner conductor; and
         a gas supply line through which gas is injected between the inner conductor and the outer conductor, and
      wherein characteristic impedance of the high-frequency transmission line is variable,
   wherein the gas supply line includes a plurality of supply lines through which gases having different permittivities are supplied,
   wherein a gas of a selected one of the plurality of supply lines is supplied between the inner conductor and the outer conductor, and
   wherein the apparatus further comprises:
      a voltmeter configured to measure voltages for respective regions of the support plate; and
      a control device configured to determine the gas injected between the inner conductor and the outer conductor, based on the voltages for the respective regions of the support plate.

2. The apparatus of claim 1, wherein the control device adjusts the characteristic impedance of the high-frequency transmission line in the range of 5 ohms to 80 ohms.

* * * * *